(12) United States Patent
Maxson et al.

(10) Patent No.: US 8,106,515 B2
(45) Date of Patent: Jan. 31, 2012

(54) LOCAL METALLIZATION AND USE THEREOF IN SEMICONDUCTOR DEVICES

(75) Inventors: Jeffery B. Maxson, Hopewell Junction, NY (US); Aurelia A. Suwarno-Handayana, Hopewell Junction, NY (US); Shamas M. Ummer, Hopewell Junction, NY (US); Kenneth J. Giewont, Hopewell Junction, NY (US); Scott Richard Stiffler, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/795,681

(22) Filed: Jun. 8, 2010

(65) Prior Publication Data

US 2010/0314689 A1 Dec. 16, 2010

Related U.S. Application Data

(62) Division of application No. 12/482,763, filed on Jun. 11, 2009, now Pat. No. 7,807,570.

(51) Int. Cl.
*H01L 23/48* (2006.01)
*H01L 23/52* (2006.01)
*H01L 29/40* (2006.01)

(52) U.S. Cl. ........ 257/758; 438/618; 438/598; 438/669; 257/E21.538; 257/E21.585; 257/E21.586

(58) Field of Classification Search ................. 438/674, 438/598, 618, 669; 257/E21.538, E21.586, 257/E21.585, 758
See application file for complete search history.

(56) References Cited

U.S. PATENT DOCUMENTS

| | | | |
|---|---|---|---|
| 4,601,779 A | 7/1986 | Abernathey et al. | |
| 4,960,489 A | 10/1990 | Roeska et al. | |
| 5,055,426 A * | 10/1991 | Manning | 438/622 |
| 5,752,182 A | 5/1998 | Nakatsuka et al. | |
| 5,792,703 A | 8/1998 | Bronner et al. | |
| 6,016,000 A * | 1/2000 | Moslehi | 257/522 |
| 6,054,370 A | 4/2000 | Doyle | |
| 6,121,659 A | 9/2000 | Christensen et al. | |
| 6,140,705 A | 10/2000 | Liu | |
| 6,303,272 B1 | 10/2001 | Furukawa et al. | |
| 6,528,409 B1 | 3/2003 | Lopatin et al. | |
| 7,067,396 B2 | 6/2006 | Aspar et al. | |
| 2006/0281240 A1* | 12/2006 | Grudowski et al. | 438/199 |
| 2006/0292858 A1 | 12/2006 | Bhattacharyya et al. | |

* cited by examiner

*Primary Examiner* — Jarrett Stark
(74) *Attorney, Agent, or Firm* — Yuanmin Cai

(57) ABSTRACT

An embodiment of the invention provides a method of creating local metallization in a semiconductor structure, and the use of local metallization so created in semiconductor structures. In one respect, the method includes forming an insulating layer on top of a semiconductor substrate; creating a plurality of voids inside the insulating layer, with the plurality of voids spanning across a predefined area and being substantially confined within a range of depth below a top surface of the insulating layer; creating at least one via hole in the insulating layer, with the via hole passing through the predefined area; and filling the via hole, and the plurality of voids inside the insulating layer through at least the via hole, with a conductive material to form a local metallization. A semiconductor structure having the local metallization is also provided.

16 Claims, 9 Drawing Sheets

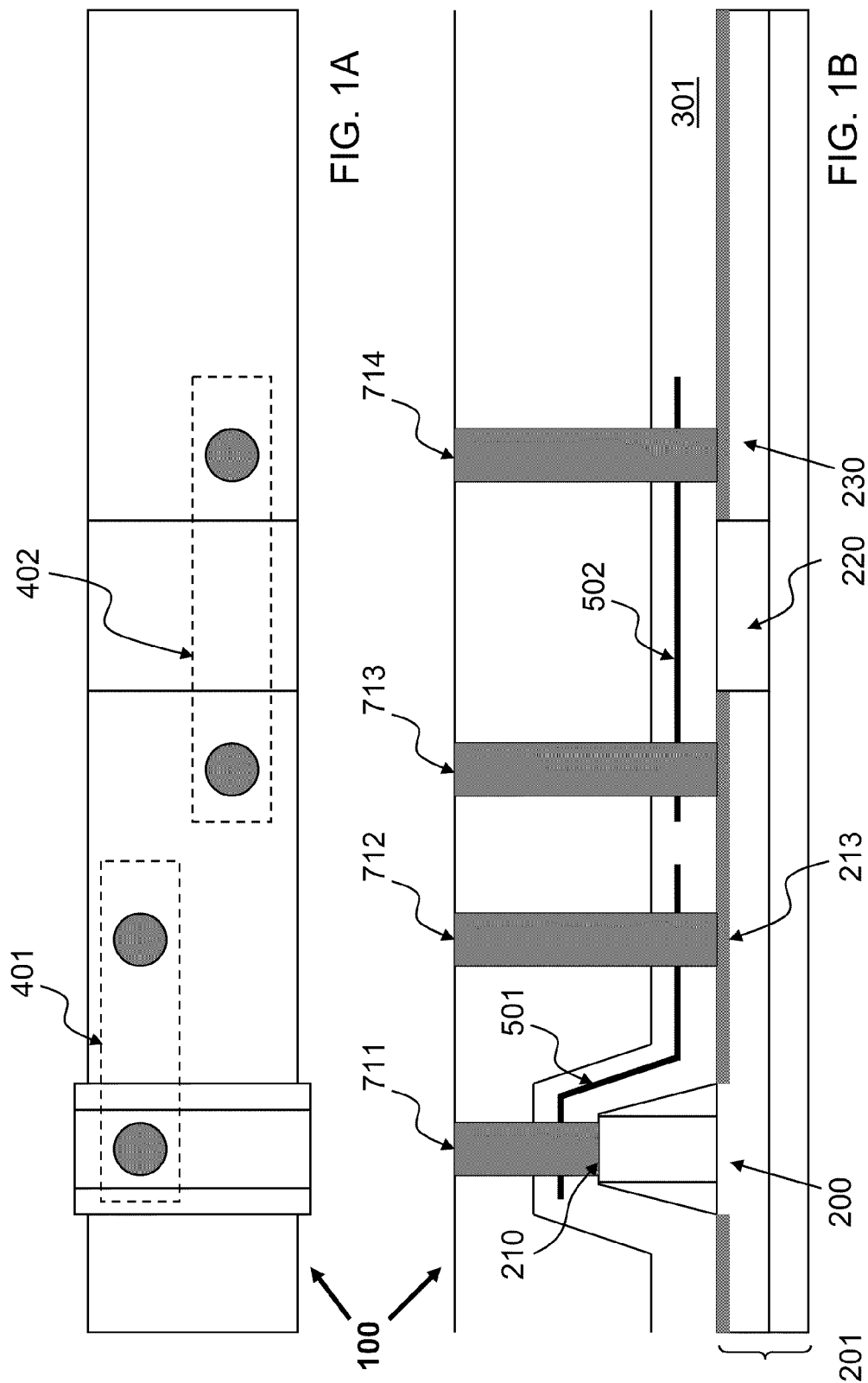

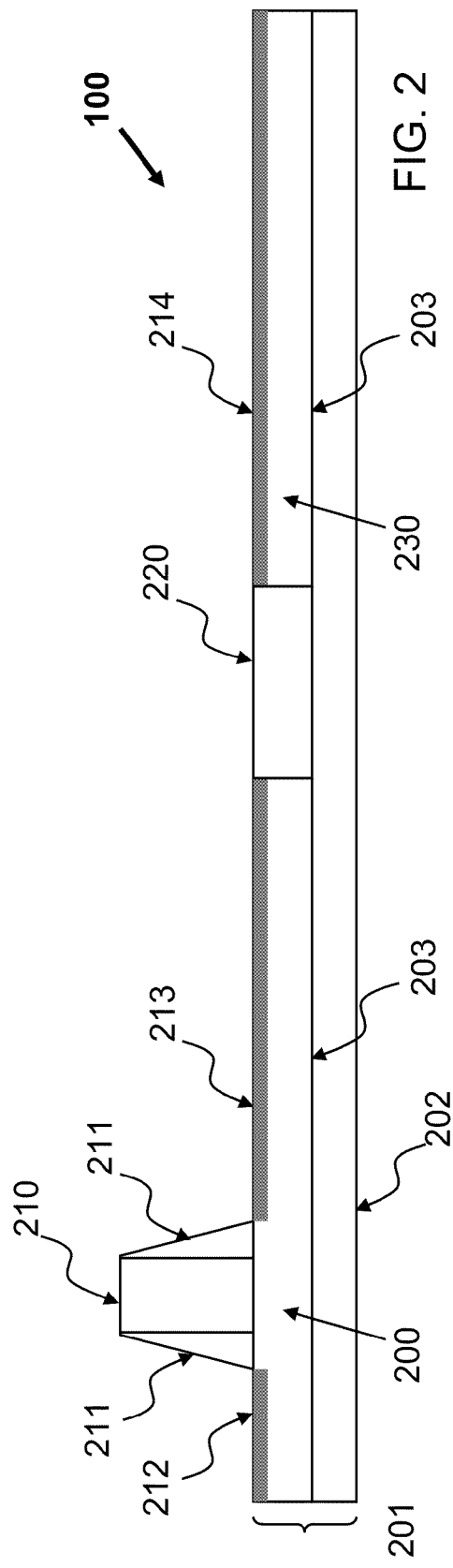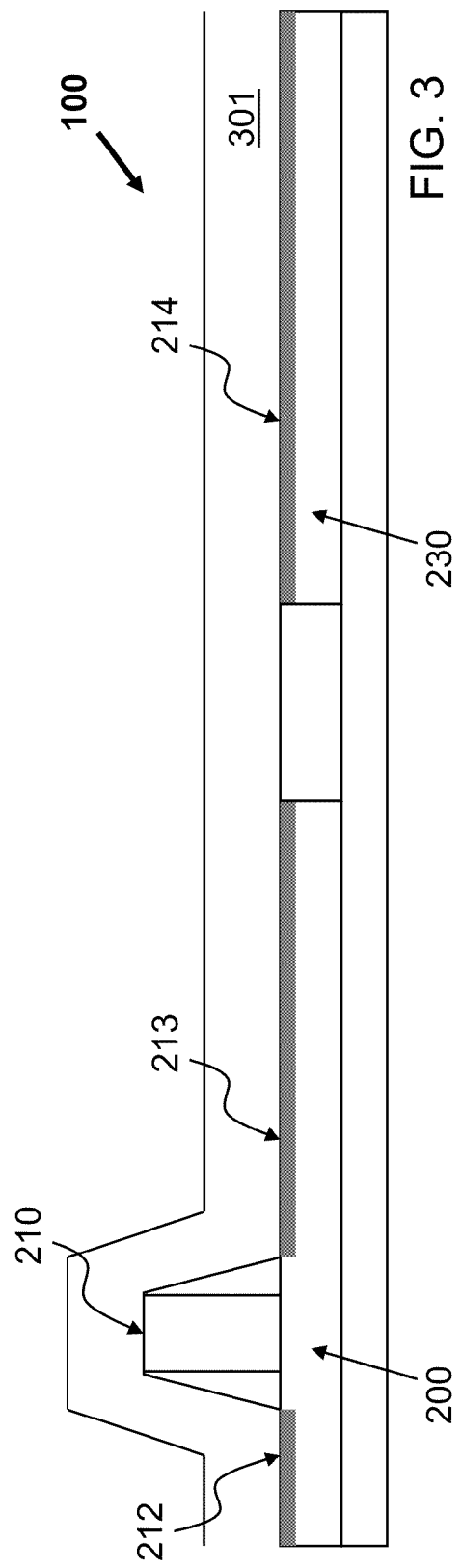

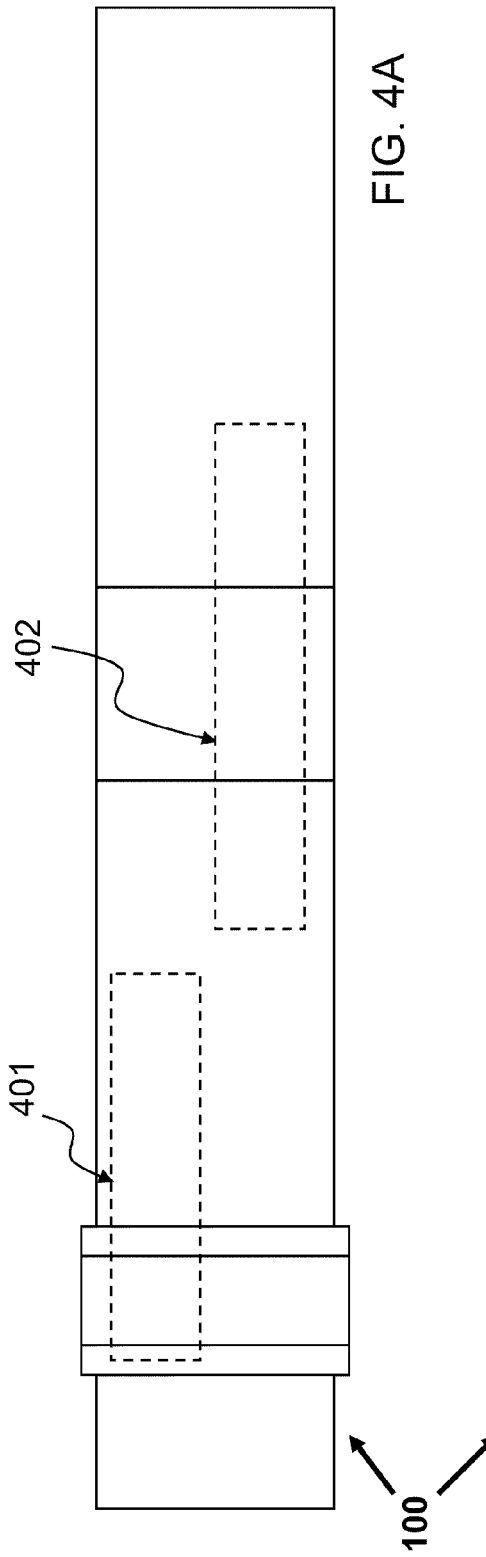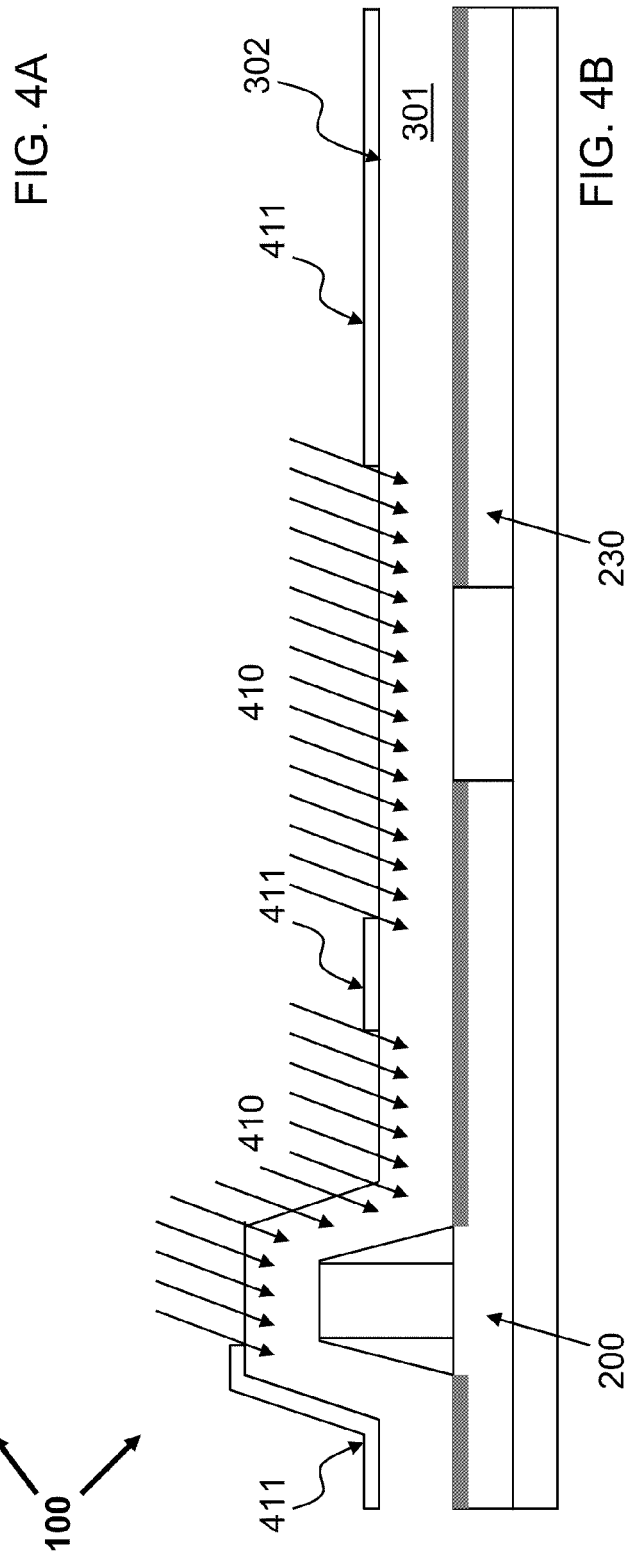

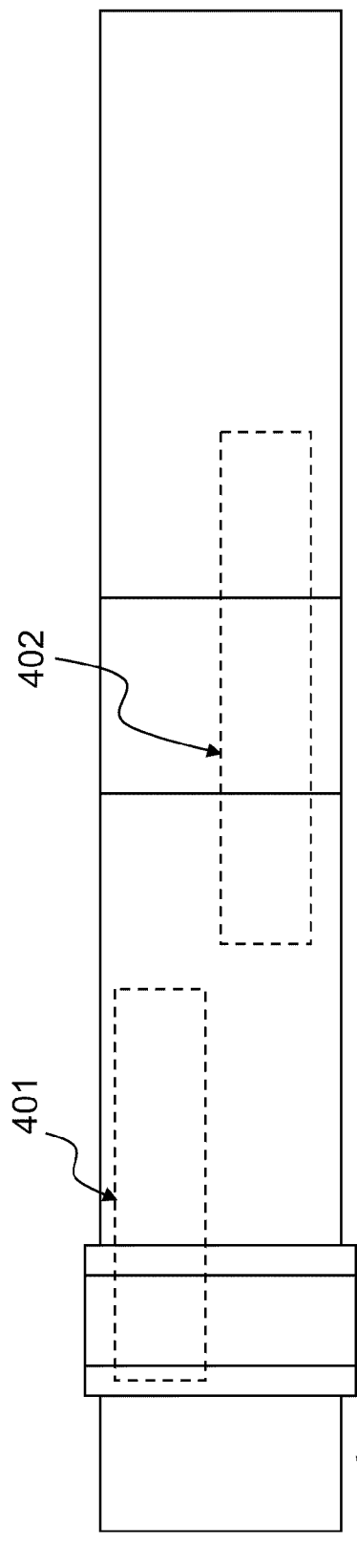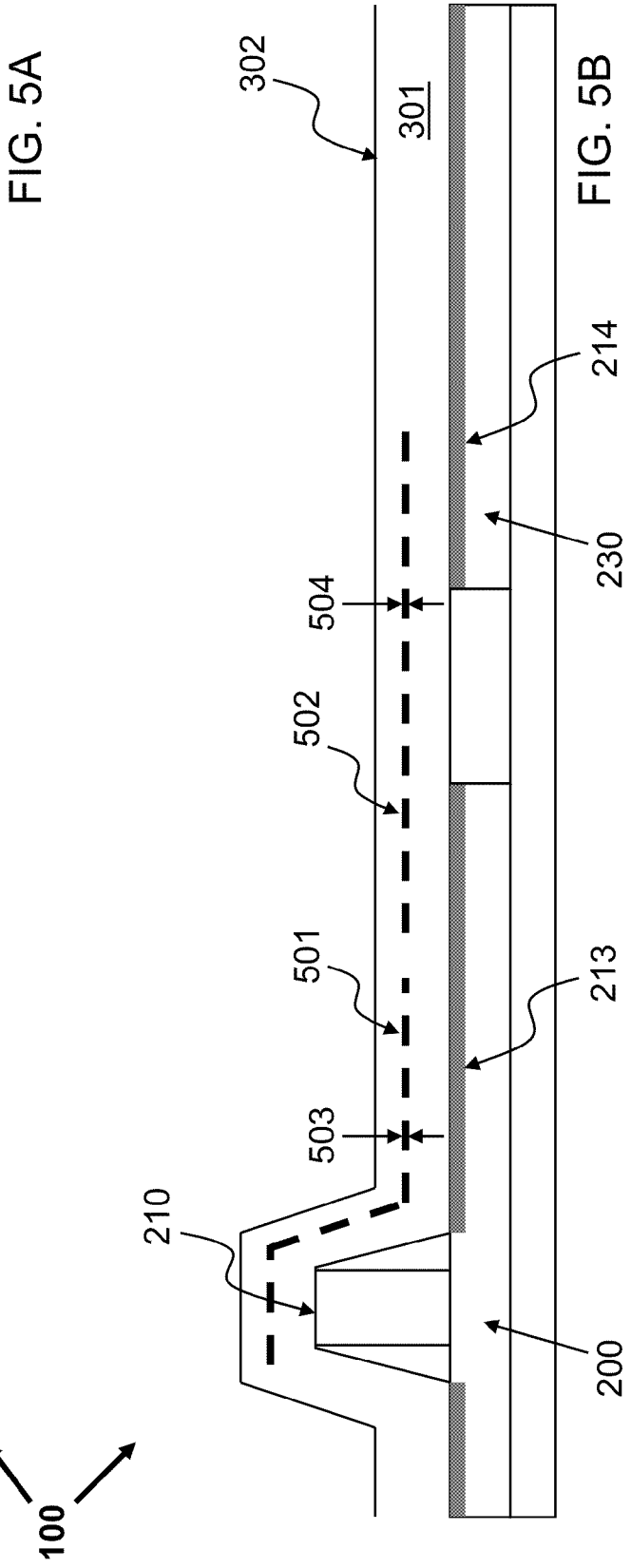

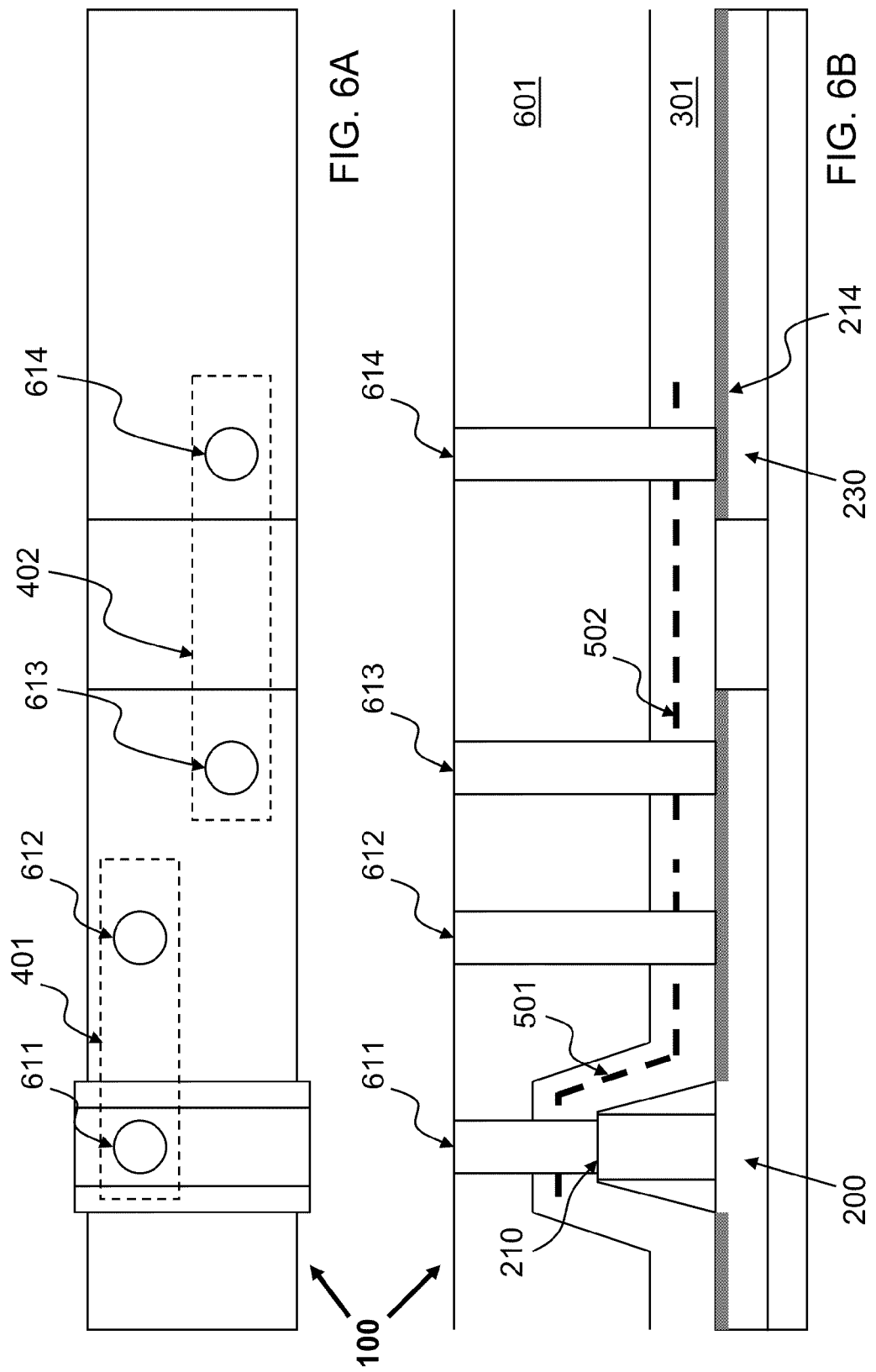

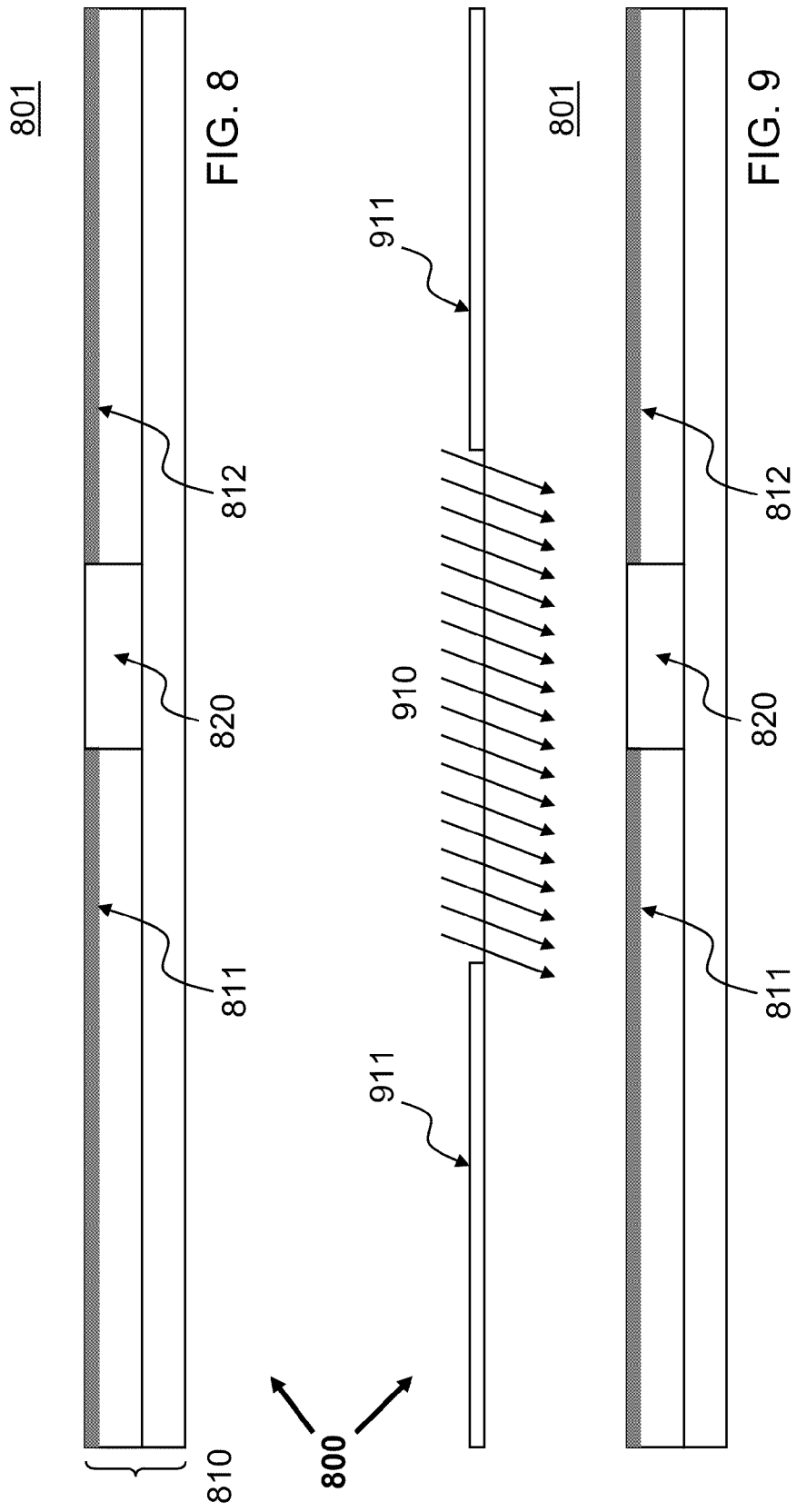

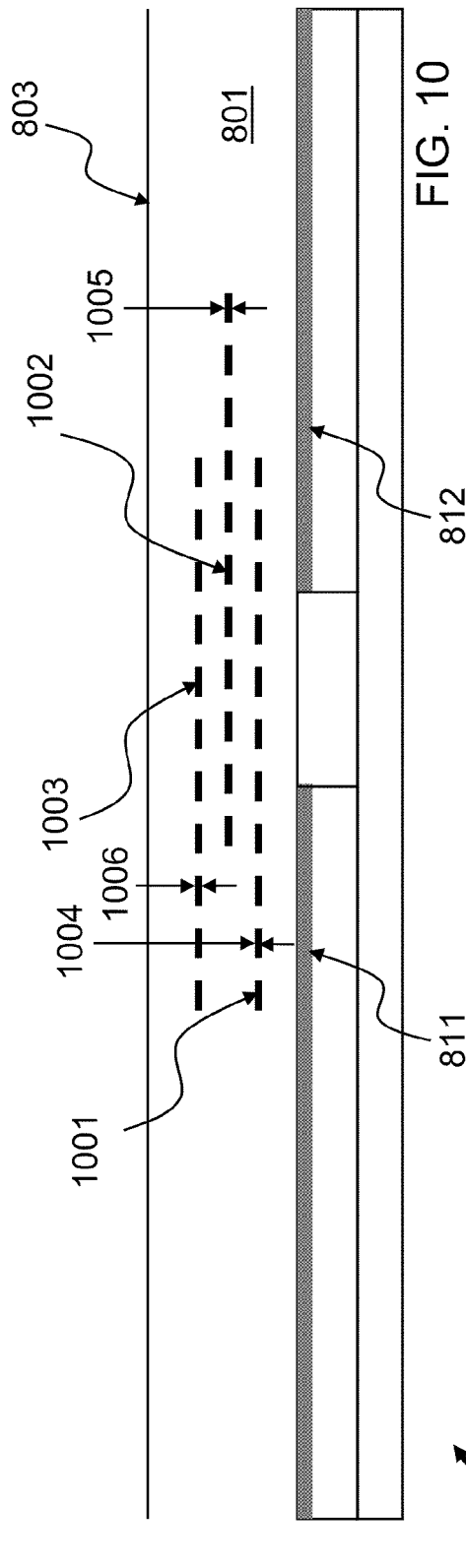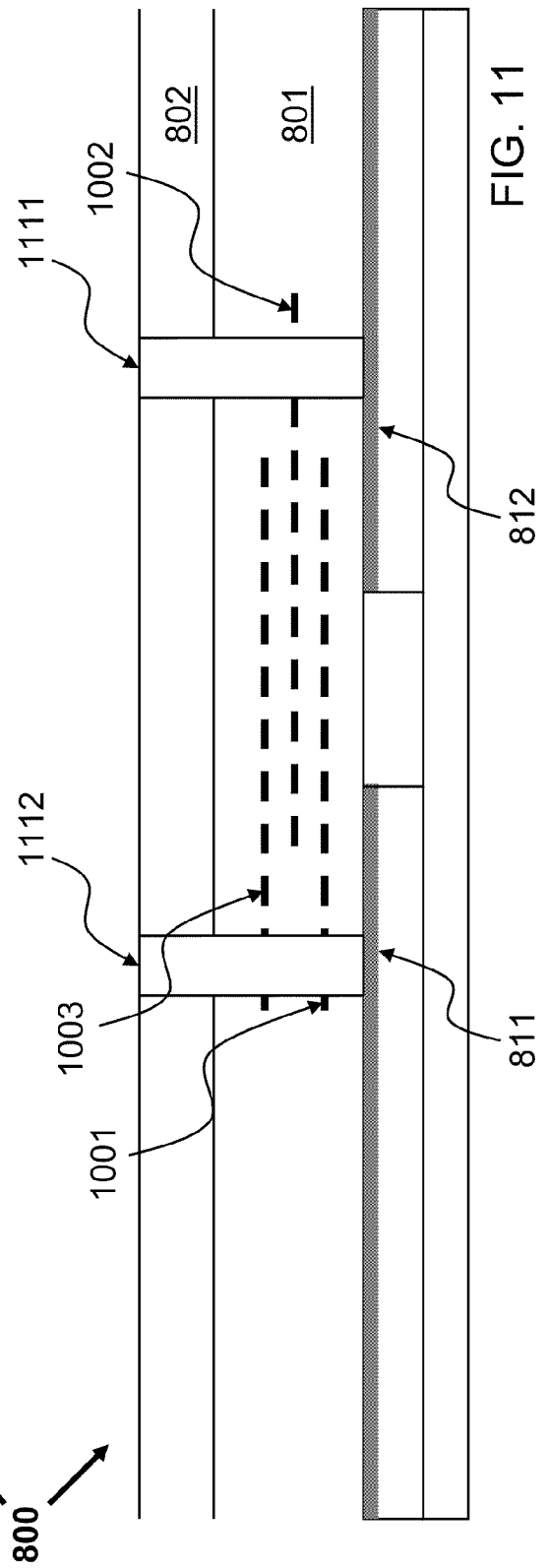

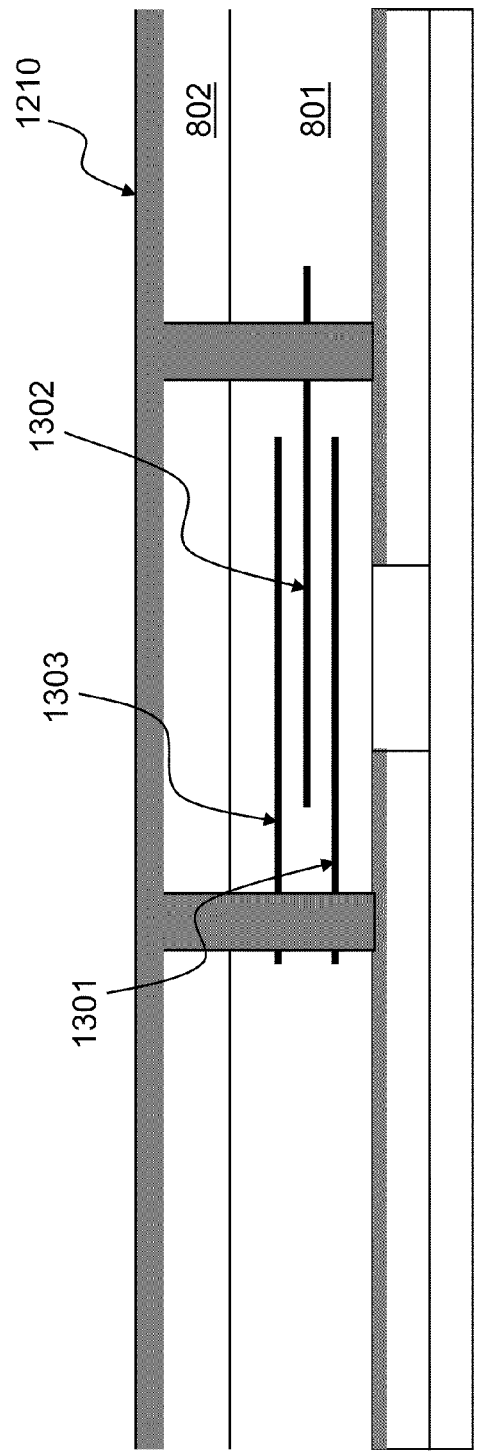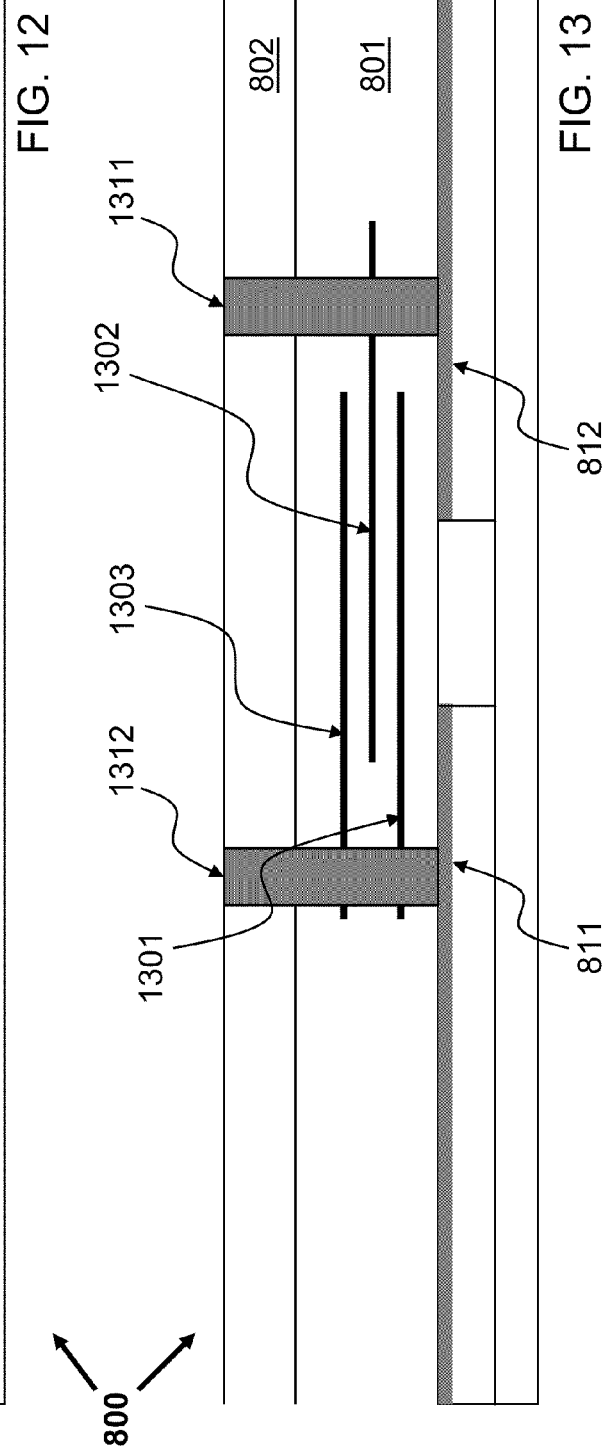

LOCAL METALLIZATION AND USE THEREOF IN SEMICONDUCTOR DEVICES

CROSS-REFERENCE TO RELATED APPLICATION

This is a divisional application of a patent application filed with the United States Patent and Trademark Office with an Ser. No. 12/482,763, entitled "LOCAL METALLIZATION AND USE THEREOF IN SEMICONDUCTOR DEVICES", filed Jun. 11, 2009.

FIELD OF THE INVENTION

The present invention relates to the field of semiconductor device manufacturing. In particular, it relates to method of creating local metallization in semiconductor structures, and the use thereof in semiconductor devices.

BACKGROUND OF THE INVENTION

In the field of semiconductor device manufacturing, active semiconductor devices such as, for example, transistors are normally manufactured or fabricated through processes such as those commonly known as front end of line (FEOL) technologies. A transistor may be, for example, a field-effect-transistor (FET) and may be a complementary metal-oxide-semiconductor field-effect-transistor (CMOS-FET). A CMOS-FET may further be a p-type dopant doped CMOS-FET (PFET) or an n-type dopant doped CMOS-FET (NFET). Different types of transistors, FETs, and/or CMOS-FETs may be manufactured or created on a common semiconductor substrate or semiconductor chip.

Following the formation of various types of semiconductor devices, interconnects for electrical connections of the various types of semiconductor devices may be made or formed in order for the various types of semiconductor devices to operate and/or interoperate properly and to provide the functionalities that they are expected by design. The interconnects for electrical connections may be made through processes such as, for example, those commonly known as back end of line (BEOL) technologies. More specifically, the interconnects may provide electrical connections between, for example, a gate and a source (or a drain) of a transistor and/or among different contact locations of different transistors and/or active or passive devices.

Electrical connections may be made at different levels, such as M1 level, M2 level . . . etc as is commonly known in the art, inside a semiconductor structure. For example, there are electrical connections known as local interconnects that may be made at a level directly above a semiconductor device or devices. Similar to other interconnects, local interconnects may be made or manufactured by a regular BEOL process. However, a regular BEOL process generally requires performing at least most of the essential steps of a damascene sequence including, for example, patterning, exposing, etching, and metal depositing, in addition to the need of creating contact-to-BEOL wiring, in order to complete the formation of the local interconnects. Therefore, with all the different and necessary processing steps in a BEOL process being considered, the existing technology of forming local interconnects is considered by the inventors as expensive, time consuming, and has a high likelihood of increasing the rates of defective devices in a final manufactured product.

SUMMARY OF THE INVENTION

An embodiment of the invention provides a method of creating local metallization for use as local interconnect of semiconductor devices and/or for forming semiconductor devices. In one respect, the method may include forming an insulating layer on top of a semiconductor substrate; creating a plurality of voids inside the insulating layer, with the plurality of voids spanning across a predefined area and being substantially confined within a range of depth below a top surface of the insulating layer; creating at least one via hole in the insulating layer, with the via hole passing through the predefined area; and filling the via hole, and the plurality of voids inside the insulating layer through at least the via hole, with a conductive material to form a local metallization.

In another embodiment of the invention, creating the plurality of voids may include implanting ions into the predefined area in the range of depth below the top surface of the insulating layer, wherein the ions may include xenon (Xe), germanium (Ge), nitrogen (N2), or a combination thereof. Further, implanting the ions into the predefined area may include first forming a resist pattern on top of the insulating layer to expose only the predefined area of the insulating layer, then implanting the ions into the exposed predefined area in a dosage ranging from about $5 \times 10^{14}$ to about $1 \times 10^{15}$ ions/cm$^2$.

In another embodiment of the invention, with the above via hole being a first via hole, the method may include creating a second via hole in the insulating layer passing through the predefined area, with the first and second via holes exposing a first and a second contact location of one or more semiconductor devices underneath the insulating layer; and filling the first and second via holes, as well as the plurality of voids inside the insulating layer through the first and second via holes, with the conductive material to form an interconnect for the one or more semiconductor devices.

In another embodiment of the invention, the predefined area of the insulating layer may be on top of the first and second contact locations of the one or more semiconductor devices formed on top of the semiconductor substrate. Additionally, at least one of the one or more semiconductor devices is a field-effect-transistor (FET) having source, drain, and gate regions, and forming the insulating layer may include forming the insulating layer directly on top of, and therefore in contact with, the source, drain, and gate regions of the FET. Further, the insulating layer may be a nitride stress liner having either compressive stress or tensile stress.

In another embodiment of the invention, the insulating layer may be formed to have a thickness of at least 45 nm and may be suitable as a stress liner and with the plurality of voids being formed at around at least 5 nm below the top surface of the insulating layer. Implanting the ions may also include implanting the ions with an energy level ranging from about 10K eV to about 60K eV and into the range of depth below the top surface of the insulating layer. Additionally, a wet cleaning of the first and second via holes may be optionally performed before filling the first and second via holes with the conductive material.

In another embodiment of the invention, filling the first and second via holes, as well as the plurality of voids inside the insulating layer through the first and second via holes, with the conductive material may include depositing a metal in the first and second via holes and, through the first and second via holes, in the plurality of voids through a chemical vapor deposition (CVD) process, with the metal being selected from a group consisting of titanium, titanium nitride, and tungsten.

In another embodiment of the invention, the first and second via holes may have a distance less than about 250 nm, with the distance being adequate for forming the plurality of voids into the interconnect using the conductive material through the first and second via holes.

Another embodiment of the invention provides a method which includes forming an insulating layer on top of a semiconductor substrate; creating a first group of voids inside the insulating layer, with the first group of voids spanning across a first predefined area and being substantially confined within a first range of depth below a top surface of the insulating layer; creating at least first via hole in the insulating layer, with the first via hole passing through the first predefined area; and filling the first via hole, and the first group of voids inside the insulating layer through at least the first via hole, with a conductive material to form a first local metallization, and subsequently or concurrently creating at least a second group of voids at a second predefined area of a second range of depth inside the insulating layer; the second range of depth may be different from the first range of depth and the second predefined area overlaps partially with the first predefined area; creating a second via hole in the insulating layer passing through the second predefined area, with the second via hole being insulated from the first predefined area by the insulating layer; and filling the second via hole, and the second group of voids inside the insulating layer through the second via hole, with another same or different conductive material to form a second local metallization; thereby the first and second local metallization forming a capacitor.

In another embodiment of the invention, the second group of voids may be created following the creation of the first group of voids and before the creation of the first and second via holes; the sizes of the first and second predefined areas may be adequate for forming the first and second groups of voids into the first and second local metallization by filling of the conductive material and the another conductive material through the first and second via holes respectively.

Another embodiment of the invention provides a semiconductor structure which may include a semiconductor substrate; an insulating layer on top of the semiconductor substrate; a via formed from a top surface of the insulating layer into the insulating layer; and a conductive area inside the insulating layer, with the conductive area spanning across a predefined area underneath the top surface of the insulating layer; being substantially confined within a range of depth below the top surface of the insulating layer; and being in contact with the via.

In another embodiment of the invention, the above via may be a first via, and the semiconductor structure includes one or more semiconductor devices underneath the insulating layer; and a second via formed from the top surface of the insulating layer into the insulating layer and being in contact with the conductive area inside the insulating layer, wherein the first and second vias are in contact with a first and a second contact location of the one or more semiconductor devices.

In yet another embodiment of the invention, the conductive area of the insulating layer may be on top of the first and second contact locations of the semiconductor devices that are formed on top of the semiconductor substrate. In addition, at least one of the semiconductor devices is a field-effect-transistor (FET) having source, drain, and gate regions, and wherein the insulating layer is directly on top of, and therefore in contact with, the source, drain, and gate regions of the FET. Moreover, the insulating layer may be a nitride stress liner having either compressive stress or tensile stress.

In yet another embodiment of the invention, the insulating layer may have a thickness of at least 45 nm suitable as a stress liner and the plurality of voids may situate at around at least 5 nm below the top surface of the insulating layer. Additionally, the conductive area inside the insulating layer may include a metal, with the metal being selected from a group consisting of titanium, titanium nitride, and tungsten, and being deposited into the conductive area.

In yet another embodiment of the invention, the above conductive area may be a first conductive area; the range of depth may be a first range of depth; and the via may be a first via, the semiconductor structure may also include at least a second conductive area inside the insulating layer, the second conductive area being substantially confined within a second range of depth below the top surface of the insulating layer, the second range of depth being different from the first range of depth, and the second conductive area overlaps partially with the first conductive area; and a second via formed from the top surface of the insulating layer into the insulating layer and being in contact with the second conductive area. Additionally the first conductive area may be insulated from the second conductive area by material of the insulating layer.

Another embodiment of the invention provides a semiconductor structure which may include one or more semiconductor devices; a first and a second via filled with one or more conductive materials, with the first and second vias being in contact with a first and a second contact location of the one or more semiconductor devices; and a wiring structure embedded inside an insulating layer, with the wiring structure connecting the first and second vias thereby providing interconnect between the first and second contact locations of the one or more semiconductor devices.

In another embodiment of the invention, the wiring structure is formed at around at least 5 nm below a top surface of the insulating layer and therefore is insulated from the top surface. In yet another embodiment of the invention, the insulating layer is formed on top of, and in direct contact with, the first and second contact locations of the one or more semiconductor devices. In yet another embodiment of the invention, at least one of the semiconductor devices is a field-effect-transistor (FET) having a source, a gate, and a drain region, and at least one of the first and second contact locations situates on top of at least one of the source, gate, and drain regions of the FET.

BRIEF DESCRIPTION OF THE DRAWINGS

The invention will be understood and appreciated more fully from the following detailed description of the invention, taken in conjunction with the accompanying drawings of which:

FIGS. 1A and 1B are demonstrative top and cross-sectional illustrations of a semiconductor structure having local metallization according to an embodiment of the invention;

FIG. 2 is a demonstrative illustration of a method of forming a semiconductor structure having local metallization according to an embodiment of the invention;

FIG. 3 is a demonstrative illustration of a method of forming a semiconductor structure having local metallization according to another embodiment of the invention;

FIGS. 4A and 4B are demonstrative top and cross-sectional illustrations of a method of forming a semiconductor structure having local metallization according to yet another embodiment of the invention;

FIGS. 5A and 5B are demonstrative top and cross-sectional illustrations of a method of forming a semiconductor structure having local metallization according to yet another embodiment of the invention;

FIGS. 6A and 6B are demonstrative top and cross-sectional illustrations of a method of forming a semiconductor structure having local metallization according to yet another embodiment of the invention;

FIG. 8 is a demonstrative illustration of a method of forming a semiconductor structure having local metallization according to another embodiment of the invention;

FIG. 9 is a demonstrative illustration of a method of forming a semiconductor structure having local metallization according to yet another embodiment of the invention;

FIG. 10 is a demonstrative illustration of a method of forming a semiconductor structure having local metallization according to yet another embodiment of the invention;

FIG. 11 is a demonstrative illustration of a method of forming a semiconductor structure having local metallization according to yet another embodiment of the invention;

FIG. 12 is a demonstrative illustration of a method of forming a semiconductor structure having local metallization according to yet another embodiment of the invention; and FIG. 13 is a demonstrative illustration of a method of forming a semiconductor structure having local metallization according to yet another embodiment of the invention.

Figure 7A:
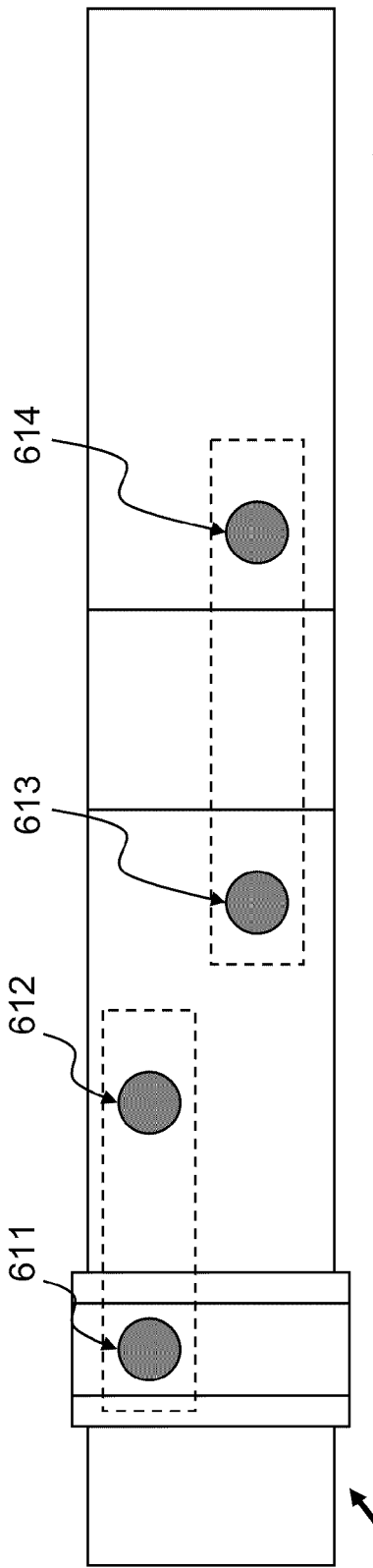
FIGS. 7A and 7B are demonstrative top and cross-sectional illustrations of a method of forming a semiconductor structure having local metallization according to yet another embodiment of the invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or patent applications for reference in order not to obscure description of essences and/or embodiments of the invention. It is to be understood that the following descriptions have rather focused on distinctive features and/or elements of various embodiments of the invention.

FIGS. 1A and 1B are demonstrative top and cross-sectional illustrations of a semiconductor structure 100 having local metallization according to an embodiment of the invention. For example, semiconductor structure 100 may be formed on a semiconductor substrate 201 to include one or more local metallization 501 and 502 in predefined or predetermined areas 401 and 402. Local metallization 501 and 502 may be wiring structures that are internal to and formed inside a dielectric layer 301, as being illustrated in FIG. 1B. Wiring structure 501 may provide local interconnect for electrical connection between, for example, a via 711 and a via 712 and similarly wiring structure 502 may provide local interconnect for electrical connection between, for example, a via 713 and a via 714. Moreover, via 711 may be in contact with a gate conductor 210 of a semiconductor device 200 such as a FET transistor. In one instance, FET transistor 200 may be a CMOS-FET and in another instance may further be a p-type dopant doped PFET or an n-type dopant doped NFET. A second via, for example via 712, may be in contact with a source 213 (or a drain) region or area of FET transistor 200. Thus, wiring structure 501 may provide a local interconnect between gate conductor 210 and source/drain region 213 of FET transistor 200.

Here, it is to be understood that the use of local metallization formed in accordance with various embodiments of the invention, as being described below in further more details, may not be limited in the above and/or below respects of being applied to only one semiconductor device, and in fact may be applied to multiple various types of, either active or passive, semiconductor devices. For example, as being illustrated in FIG. 1B, wiring structure 502 may provide local interconnect between via 713 and via 714, which may be in contact with semiconductor device 200 and another same or different type of semiconductor device 230 respectively. Semiconductor devices 200 and 230 may be separated and/or insulated by a shallow trench isolation (STI) 220. According to another embodiment of the invention, other types of use of local metallization may also be possible. For example, one or more local metallization may be used together to form a semiconductor capacitor as being described below in further more details with reference to FIGS. 8-13.

According to an embodiment of the invention, wiring structures 501 and 502 may be internal to and formed inside dielectric layer 301, which may be an electrically insulating layer and formed on top of semiconductor devices 200 and/or 230 directly. Local metallization or wiring structures 501 and 502 may be formed in predefined or predetermined areas 401 and 402 that are at least partially, in vertical direction, on top of contact areas or locations of semiconductor devices 200 and/or 230 such that vias 711, 712, 713, and/or 714 being formed in contact with contact areas of semiconductor devices 200 and/or 230 may be interconnected by wiring structures 501 and/or 502.

FIG. 2 is a demonstrative illustration of a method of forming semiconductor structure 100 having local metallization according to an embodiment of the invention. For example, an embodiment of the invention may include forming semiconductor devices 200 and 230 on a semiconductor substrate 201. As is known in the art, substrate 201 may be a bulk silicon layer, or may be a silicon-on-insulator (SOI) layer 203 formed on top of a silicon wafer 202. Semiconductor device 200 may be, for example, a FET transistor and therefore may include a gate conductor 210, a pair of spacers 211 adjacent to sidewalls of gate conductor 210, and source and drain regions (or areas) 212 and 213 next to spacers 211. Top surfaces of source/drain areas 212 and 213 and top surface of gate conductor 210 may function as contact locations of FET transistor 200, and may be optionally silicided for improved conductivity. Semiconductor device 230 may be a FET transistor as well, similar to FET transistor 200, or may be any other types of semiconductor devices, active or passive.

Here, it is to be understood that embodiments of the invention are not limited in the above and/or below respects. For example, embodiments of the invention may be applied to various types of semiconductor devices and/or structures, such as an interconnect structure being formed on top of other semiconductor devices, in addition to being applied to the fore-mentioned semiconductor devices 200 and 230. Semiconductor device 230 may include a silicided surface 214 and hereinafter, for simplicity but without loosing generality, may be referred to by silicided surface 214 that may function as a contact location for semiconductor device 230 in general. Reference to details of semiconductor device 230 may be omitted wherever possible and wherever such detailed description of semiconductor device 230 may be unnecessary, in order not to obscure essences of the invention. As being illustrated in FIG. 2, semiconductor devices 200 and 230 may be separated or insulated by a shallow trench isolation (STI) 220 formed inside substrate 201.

FIG. 3 is a demonstrative illustration of a method of forming semiconductor structure 100 having local metallization according to another embodiment of the invention. For example, an embodiment of the invention may include depositing a barrier layer (or film) 301 directly on top of semiconductor devices 200 and 230 covering contact locations of gate conductor 210 and source/drain areas 212 and 213 of semiconductor device 200 and contact location 214 of semiconductor device 230. Insulating layer 301 may be, for example, a silicon oxide layer or silicon nitride layer and therefore be an insulating layer 301. According to another embodiment of the invention, insulating layer 301 may be a liner or lining layer having either compressive stress or tensile stress. However, it is to be understood that insulating layer 301 is not limited to stress liners and may be any non-stress liner as well. Deposition of insulating layer 301 may be made through any known or future developed technologies such as, for example, a chemical vapor deposition (CVD) process, a high density plasma deposition (HDP) process, a plasma-enhanced CVD (PECVD) process, or a physical vapor deposition (PVD) process. According to another embodiment, insulating layer 301 may be formed conformally on top of semiconductor devices 200 and 230 to have a preferred thickness of, for example, at least 40 nm. In other words, insulating layer 301 may be formed to have a thickness that is sufficient to host or contain local interconnects or local metallization therein, the formation of which being described below in more details. In yet another embodiment, the thickness of insulating layer 301 may be preferably made between about 45 nm and about 100 nm.

FIGS. 4A and 4B are demonstrative top and cross-sectional illustrations of a method of forming semiconductor structure 100 having local metallization according to yet another embodiment of the invention. For example, an embodiment of the invention may include forming a resist pattern 411 on top of insulating layer 301, through for example a lithographical technique, thereby defining one or more areas 401 and 402, as being illustrated in FIG. 4A, for forming one or more local metallization or local interconnects. Following the patterning of resist pattern 411, areas of insulating layer 301 that are exposed and designated for local metallization or local interconnects may be subjected to a process 410 which may create localized voids inside insulating layer 301. The localized voids may span across predefined areas 401 and 402, and may be created substantially around a predefined depth, preferably in a range from about 5 nm to about 20 nm, below a top surface 302 of insulating layer 301 and throughout predefined areas 401 and 402. The range of depth may be made sufficiently below the top surface of insulating layer 301, such that any subsequently formed local metallization or local interconnects inside insulating layer 301, through filling the voids with a conductive material as being described below in more details, may be insulated from the top surface of insulating layer 301. However, it is to be understood that embodiments of the invention are not limited in this respect and additional barrier layer(s) or insulating layer(s) may be formed on top of insulating layer 301 if necessary and if the subsequently formed local metallization or local interconnects are not sufficiently insulated from the top surface of insulating layer 301.

According to another embodiment, the localized voids may be made or created below the top surface of insulating layer 301 just deep enough so that they may not be filled up by any dielectric material to be deposited later on top of insulating layer 301. The localized voids may be created through, for example, an ion-implantation process 410 although other existing or future developed techniques are also contemplated here. Ions of different types may be used in the ion-implantation process including, but not limited to, xenon (Xe), germanium (Ge), nitrogen ($N_2$), or a combination thereof. The ions may be implanted at certain dosage levels to achieve appropriate void density, and certain energy levels to achieve appropriate depths into the insulating layer 301. For example, the implantation may be carried out with a dosage level between about $5\times10^{14}$ and about $1\times10^{15}$ ion/cm$^2$ at an energy level, which depends upon the type of ions used, between about 10K electron-volt (eV) and about 60K eV. For example, an energy level of around 30K eV to 60K eV may be used for xenon (Xe); around 30K eV to 40K eV may be used for germanium (Ge); and around 14K eV to 25K eV may be used for $N_2$.

FIGS. 5A and 5B are demonstrative top and cross-sectional illustrations of a method of forming semiconductor structure 100 having local metallization according to yet another embodiment of the invention. For example, an embodiment of the invention may include removing resist pattern 411 of FIG. 4 that was formed on top of insulating layer 301 using well-known techniques, such as a wet-etch technique, after the ion-implantation process. While FIG. 5A illustrates predefined areas 401 and 402 that are designated for forming local metallization or local interconnects later, FIG. 5B illustrates, in dashed lines, that localized voids 501 may be created that are at least partially and vertically over contact locations of gate conductor 210 and source/drain area 213 of FET transistor 200, and localized voids 502 are created that are at least partially and vertically over contact location 213 of source/drain area 213 of FET transistor 200 and contact location 214 of semiconductor device 230. Here, it is to be understood that voids 501 and 502 are created to be substantially confined within ranges of depth 503 and 504, respectively, below the top surface 302 of insulating layer 301.

FIGS. 6A and 6B are demonstrative top and cross-sectional illustrations of a method of forming semiconductor structure 100 having local metallization according to yet another embodiment of the invention. Following forming localized or local voids 501 and 502 inside insulating layer 301, an embodiment of the invention may include forming an inter-level dielectric (ILD) layer 601 on top of insulating layer 301 by any currently existing or future developed processes. However, it is to be understood that embodiments of the invention may not be limited in this respect of forming ILD layer 601 on top of insulating layer 301 and, for example, in some instances insulating layer 301 may be made thick enough and therefore may function as an inter-level dielectric layer so that no separate ILD layer is necessary to be formed on top of insulating layer 301.

Following the formation of ILD layer 601, another embodiment of the invention may include forming or creating one or more via holes 611, 612, 613, and/or 614 which may pass through both ILD layer 601 and insulating layer 301, thereby exposing contact locations of semiconductor devices 200 and 230 underneath insulating layer 301. The creation of via holes 611, 612, 613, and/or 614 may be made or created by applying any conventional etching process or technique and may be formed through areas of predefined or predetermined areas 401 and 402 designated for forming local metallization or local interconnects. For example, via hole 611 may pass through local voids 501 formed inside insulating layer 301 in predetermined area 401 and may expose gate conductor 210 of semiconductor device 200. Similarly, via hole 614 may pass through voids 502 formed inside insulating layer 301 in predetermined area 402 and may expose silicided contact location 214 of semiconductor device 230.

Another embodiment of the invention may include a step of unzipping to further open up localized voids 501 and 502 inside insulating layer 301 after via holes 611, 612, 613, and/or 614 have been created. This step of further opening up local voids 501 and 502 may facilitate, in a later step, a process of metal diffusion into local voids 501 and 502 in transforming local voids 501 and 502 into local metallization which may then be used as local interconnects. For example, a wet cleaning process may be optionally employed to unzip and/or open up voids 501 and 502. The optional wet cleaning process may employ a solution that contains, for example, DI water, $H_2O_2$, and $NH_4OH$. The wet-cleaning may be performed at a temperature of around 40 to 50 degree C.

Figure 7B:
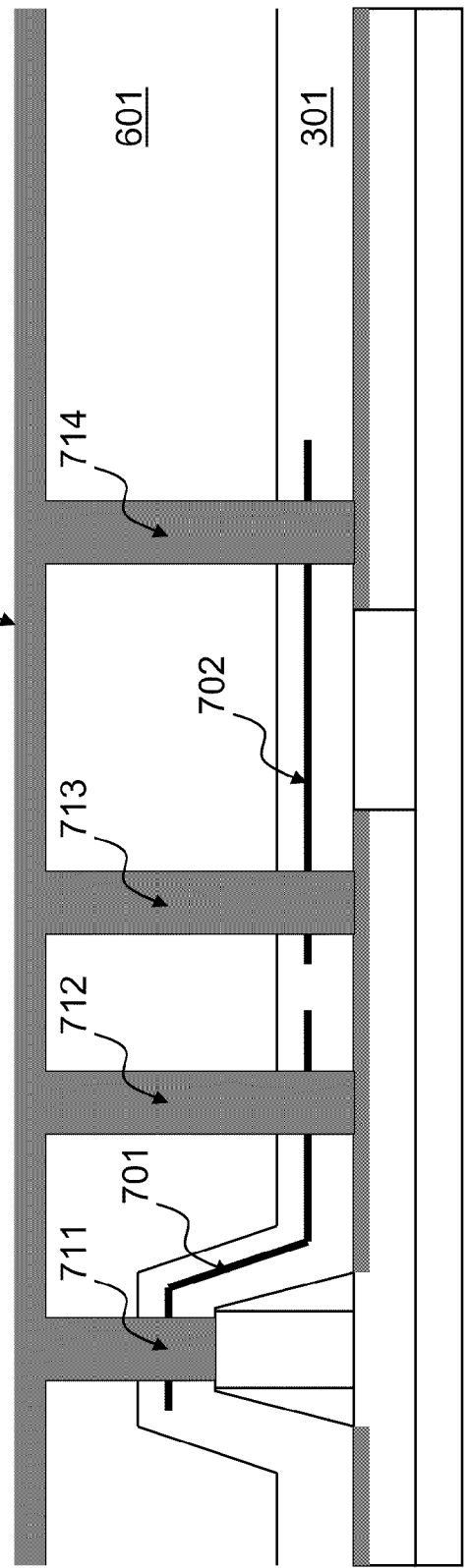

FIGS. 7A and 7B are demonstrative top and cross-sectional illustrations of a method of forming semiconductor structure 100 having local metallization according to yet another embodiment of the invention. For example, an embodiment of the invention may include filling via holes 611, 612, 613, and/or 614 with a conductive material or materials to form vias 711, 712, 713, and/or 714. The filling of conductive materials may be made through any existing or future developed metal deposition process such as, for example, a chemical vapor deposition (CVD) process, although embodiments of the invention may not be limited in this respect and other method of filling via holes 611, 612, 613, and/or 614 with conductive materials may be used to form vias 711, 712, 713, and/or 714. According to another embodiment of the invention, same or different types of conductive materials may be used in forming vias 711, 712, 713, and/or 714 and the conductive materials may include, for example, titanium, titanium nitride, tungsten, tantalum, tantalum nitride, aluminum, copper, and a combination thereof.

During the process of depositing conductive material(s) into via holes 611, 612, 613, and/or 614, the conductive material(s) may also diffuse and fill local voids 501 and 502 of FIG. 6B created inside insulating layer 301 through via holes 611, 612, 613, and/or 614. The filling of local voids 501 and 502 of FIG. 6B may eventually create a solid, continuous, and conductive wiring structure 701 and 702 which may interconnect via 711 with via 712, and via 713 with via 714, respectively. According to yet another embodiment of the invention, in order to facilitate the diffusion process of filling local voids 501 and 502 of FIG. 6B, a low temperature annealing process may be employed to help cause the conductive material move deeper into the regions of voids 501 and 502 of FIG. 6B.

According to yet another embodiment of the invention, wiring or interconnect structure formed by diffusing conductive material or materials into voids through via holes may be made with the conductive path (formed by the voids) being limited to have a length less than a predetermined value. The length of the conductive path may be limited and/or affected by conditions under which conductive materials are deposited into, for example, via holes 611, 612, 613, and/or 614 and then diffused into, for example, voids 501 and 502 of FIG. 6B. For example, the conductive path formed by the filling of voids may have a length less than approximately 140 nm. However, depending on the conditions used in forming vias 711, 712, 713, and/or 714 through deposition and also depending on sizes of the voids 501 and 502 created through ion-implantation, the length of local metallization or conductive paths 701 and 702 may be extended to cover a distance between about 140 nm to about 250 nm. Therefore, according to an embodiment of the invention, the wiring structure or wiring level formed inside insulating layer 301 may be best suited for connecting contacts within a device or among adjacent devices.

As is illustrated in FIG. 7B, the deposition process of conductive material(s) into via holes 611, 612, 613, and/or 614 may cause the formation of a conductive layer 710 covering a top surface of ILD layer 601. This layer of conductive material may be removed by, for example, a chemical mechanical polishing (CMP) process, as is known in the art, thereby creating semiconductor device 100 as shown in FIGS. 1A-1B.

According to an embodiment of the invention, local metallization may also be created to form various semiconductor devices other than local interconnects, as being described above such as, for example capacitors to be used in a semiconductor structure.

FIG. 8 is a demonstrative illustration of a method of forming a semiconductor structure 800 having local metallization according to another embodiment of the invention. For example, an embodiment of the invention may include depositing a dielectric layer or insulating layer 801 on top of a semiconductor substrate 810. Dielectric layer 801 may be deposited to have a thickness that is sufficiently thick to be able to host or hold at least two stacked but mutually insulated local metallization as being described below in more details. According to another embodiment of the invention, surface of semiconductor substrate 810 may include silicided surfaces 811 and 812 and, in this case, silicided surfaces 811 and 812 may be separated or insulated by a shallow trench isolation (STI) 820. However, it is to be understood that embodiments of the invention are not limited in this respect and surface of semiconductor substrate 810 may not necessarily be silicided.

FIG. 9 is a demonstrative illustration of a method of forming semiconductor structure 800 having local metallization according to yet another embodiment of the invention. For example, an embodiment of the invention may include forming a resist pattern 911 on top of insulating layer 801, exposing only areas where local metallization are to be formed. The formation of resist pattern 911 may be made by applying for example a standard lithographical process. The resist pattern 911 may expose an area of insulating layer 801 directly above STI 820 and the adjacent portions of silicide surfaces 811 and 812 and may cover the rest surface of insulating layer 801. Following the formation of resist pattern 911, another embodiment of the invention may include implanting ions 910, for example, xenon (Xe), germanium (Ge), nitrogen ($N_2$), or a combination thereof, into insulating layer 801 at the areas predefined by resist pattern 911 to create localized voids.

FIG. 10 is a demonstrative illustration of a method of forming semiconductor structure 800 having local metallization according to yet another embodiment of the invention. For example, the ion-implantation process 910 of FIG. 9 may create at least a first group of voids 1001 and a second group of voids 1002 inside insulating layer 801. Additional group or groups of voids, such as group 1003 of voids, may be created depending upon the design of semiconductor devices to be manufactured. Another embodiment of the invention may include creating different groups of voids 1001, 1002, and 1003 inside insulating layer 801, at different levels or ranges of depth 1004, 1005, and 1006 respectively underneath a top surface 803 of insulating layer 801, and achieving these different levels or ranges of depth 1004, 1005, and 1006 of voids by controlling the ion energy used in implantation at appropriate for example calibrated levels. For example, voids of group 1001 may be created at an energy level of about 60K eV, and voids of group 1002 may be created at an energy level of about 30K eV. In addition, the voids may be created or formed to be substantially around their respective levels or ranges of depth inside insulating layer 801 by controlling the accuracy of energy levels used.

In FIG. 10, it is demonstratively illustrated that an embodiment of the invention may include creating group of voids 1001 to be partially overlapped with group of voids 1002 and group of voids 1002 to be partially overlapped with group of voids 1003. At least a portion of group 1001 and group 1003 may formed to be on top of silicide surface 811, and at least a portion of group 1002 may be formed to be on top of silicide surface 812.

FIG. 11 is a demonstrative illustration of a method of forming semiconductor structure 800 having local metallization according to yet another embodiment of the invention. For example, an embodiment of the invention may include depositing an ILD layer 802, which may be a CA-ILD layer for example, on top of insulating layer 801. ILD layer 802 may have a thickness that may be designed and/or decided by for example adjacent devices and/or selected to fit into a general device manufacturing process. However, it is to be understood that embodiments of the invention may not be limited in this respect and other factors may decide or at least influence the selection of thickness of ILD layer 802. Via holes 1111 and 1112 may be formed inside both ILD layer 802 and insulating layer 801. For example, in one embodiment via hole 1111 may be formed to pass through the group of voids 1002 and in another embodiment via hole 1111 may expose silicide surface 812. When via hole 1111 is made to exposes silicide surface 812 and later is formed into a via 1311 of FIG. 13 contacting silicide surface 812, silicide surface 812 may serve as a contact point for device 800. Otherwise and/or alternatively, a separate contact point for device 800 may be formed. In another embodiment of the invention, via hole 1111 may be separated or insulated from group of voids 1001 or group of voids 1003.

Similarly, via hole 1112 may be formed to pass through group of voids 1001 and group of voids 1003 and may expose silicide surface 811 underneath insulating layer 801. Silicide surface 811 may serve as a contact point for device 800 when it is exposed by via hole 1112 and later be formed into a via 1312 of FIG. 13. Via hole 1112 may be separated or insulated from group of voids 1002.

FIG. 12 is a demonstrative illustration of a method of forming semiconductor structure 800 having local metallization according to yet another embodiment of the invention. For example, an embodiment of the invention may include depositing one or more conductive material such as titanium, titanium nitride, tungsten, tantalum, tantalum nitride, aluminum, copper, or a combination thereof into via holes 1111 and 1112 of FIG. 11. Deposition of the conductive material or materials may cause the conductive material(s) to fill and/or diffuse into the groups of voids 1001, 1002, and 1003 of FIG. 11 and, as a result, transform the group of voids 1001, 1002, and 1003 of FIG. 11 into conductive sheets or layers 1301, 1302, and 1303 inside insulting layer 801, as being illustrated in FIG. 12. As being described above, in order to further facilitate the diffusion or filling process, the groups of voids 1001, 1002, and 1003 of FIG. 11 may have been subjected to an optional wet cleaning process, after their formation through the ion-implantation process, to unzip and open up the voids. Alternatively and/or additionally, the process of forming conductive sheets or layers 1301, 1302, and 1303 may be further facilitated through a low temperature annealing process after the deposition of the conductive material(s). After the deposition process, as shown in FIG. 12, some conductive materials may remain on top of ILD layer 802 forming a conductive layer 1210.

FIG. 13 is a demonstrative illustration of a method of forming semiconductor structure 800 having local metallization according to yet another embodiment of the invention. Here, an embodiment of the invention may remove the conductive layer 1210, as shown in FIG. 12, by applying a chemical mechanical polishing (CMP) process or any other suitable techniques. The removal of conductive layer 1210 of FIG. 12 may expose conductive vias 1311 and 1312 formed inside ILD layer 802 (and insulating layer 801). For example, conductive via 1311 may be in contact with conductive sheet 1302, and conductive via 1312 may be in contact with conductive sheets 1301 and 1303. In FIG. 13, the overlapping of conductive sheets 1301, 1302, and 1303 forms semiconductor structure 800, which in this case may be a capacitor 800 with silicide surfaces 811 and 812 functioning as contact points of terminals of capacitor 800. According to another embodiment of the invention, when conductive vias 1311 and 1312 are not in contact with silicide surface 811 and 812 or when surface of semiconductor substrate 810 is not silicided and/or not sufficiently conductive to function as contact points, separate contact points may be formed, through conductive vias 1311 and 1312, to access capacitor 800. For example, contact points may be made through the top surface of ILD layer 802 to vias 1311 and 1312.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A semiconductor structure comprising:
   one or more semiconductor devices formed on a semiconductor substrate;
   an insulating layer on top of and covering said one or more semiconductor devices, wherein said insulating layer is a conformal insulating layer having a top surface representing a topology of said one or more semiconductor devices underneath thereof;
   a via formed from said top surface of said insulating layer into said insulating layer; and
   a conductive area inside said insulating layer, said conductive area spanning across a predefined area underneath said top surface of said insulating layer; being substantially confined within a range of depth below said top surface of said insulating layer; and being in contact with said via.

2. The semiconductor structure of claim 1, wherein said via is a first via, further comprising:
   a second via formed from said top surface of said insulating layer into said insulating layer and being in contact with said conductive area inside said insulating layer,
   wherein said first and second vias are in contact with a first and a second contact location of said one or more semiconductor devices.

3. The semiconductor structure of claim 2, wherein said conductive area of said insulating layer is on top of said first and second contact locations of said one or more semiconductor devices that are formed on top of said semiconductor substrate.

4. The semiconductor structure of claim 3, wherein at least one of said one or more semiconductor devices is a fieldeffect-transistor (FET) having source, drain, and gate regions, and wherein said insulating layer is directly on top of, and therefore in contact with, said source, drain, and gate regions of said FET.

5. The semiconductor structure of claim 1, wherein said insulating layer is a nitride stress liner having either compressive stress or tensile stress.

6. The semiconductor structure of claim 5, wherein said insulating layer has a thickness of at least 45 nm being suitable as a stress liner and said conductive area situates at around at least 5 nm below said top surface of said insulating layer.

7. The semiconductor structure of claim 6, wherein said conductive area inside said insulating layer comprises a metal, said metal being deposited into said conductive area and being selected from a group consisting of titanium, titanium nitride, and tungsten.

8. The semiconductor structure of claim 1, wherein said conductive area is a first conductive area; said range of depth is a first range of depth; and said via is a first via, said semiconductor structure further comprising:
- at least a second conductive area inside said insulating layer, said second conductive area being substantially confined within a second range of depth below said top surface of said insulating layer, said second range of depth being different from said first range of depth, and said second conductive area overlapping partially with said first conductive area; and
- a second via formed from said top surface of said insulating layer into said insulating layer and being in contact with said second conductive area.

9. The semiconductor structure of claim 8, wherein said first conductive area is insulated from said second conductive area by material of said insulating layer, further comprising an inter-level dielectric layer on top of said insulating layer.

10. A semiconductor structure comprising:
- one or more semiconductor devices;
- a first and a second via filled with one or more conductive materials, said first and second vias being in contact with a first and a second contact location of said one or more semiconductor devices; and
- a wiring structure embedded inside an insulating layer, said wiring structure connecting said first and second vias thereby providing interconnect between said first and second contact locations of said one or more semiconductor devices,
- wherein said insulating layer is a conformal insulating layer formed directly on top of said one or more semiconductor devices, having a top surface mirroring a topology of said one or more semiconductor devices underneath thereof.

11. The semiconductor structure of claim 10, wherein said wiring structure is formed at around at least 5 nm below a top surface of said insulating layer and therefore is insulated from said top surface of said insulating layer.

12. The semiconductor structure of claim 10, wherein said insulating layer is formed on top of, and in direct contact with, said first and second contact locations of said one or more semiconductor devices.

13. The semiconductor structure of claim 10, wherein at least one of said one or more semiconductor devices is a field-effect-transistor (FET) having a source, a gate, and a drain region, and at least one of said first and second contact locations situates on top of at least one of said source, gate, and drain regions of said FET.

14. The semiconductor structure of claim 10, wherein said insulating layer is a nitride stress liner having either compressive stress or tensile stress.

15. The semiconductor structure of claim 10, wherein said insulating layer is a nitride stress liner having compressive stress.

16. The semiconductor structure of claim 10, wherein said insulating layer is a nitride stress liner having tensile stress.

* * * * *